(12) United States Patent
Zhang et al.

(10) Patent No.: US 8,536,047 B2
(45) Date of Patent: Sep. 17, 2013

(54) METHODS AND SYSTEMS FOR MATERIAL BONDING

(75) Inventors: Wenqi Zhang, Leuven (BE); Eric Beyne, Leuven (BE)

(73) Assignee: IMEC, Leuven (BE)

( * ) Notice: Subject to any disclaimer, the term of this patent is extended or adjusted under 35 U.S.C. 154(b) by 321 days.

(21) Appl. No.: 13/051,357

(22) Filed: Mar. 18, 2011

(65) Prior Publication Data
US 2011/0233792 A1     Sep. 29, 2011

Related U.S. Application Data

(63) Continuation of application No. PCT/EP2009/062125, filed on Sep. 18, 2009.

(60) Provisional application No. 61/098,194, filed on Sep. 18, 2008.

(51) Int. Cl.
*H01L 21/44* (2006.01)

(52) U.S. Cl.
USPC ........... 438/614; 257/E23.021; 257/778; 257/781; 257/786; 438/108; 438/612; 420/558

(58) Field of Classification Search
USPC .......... 257/E23.01, E23.021, 738, 748, 257/762, 772, 773, 775, 778–781, 786; 438/108, 612, 614, 638, 666; 420/558, 560; 228/180.22
See application file for complete search history.

(56) References Cited

U.S. PATENT DOCUMENTS

| | | | | |
|---|---|---|---|---|
| 3,839,727 A * | 10/1974 | Herdzik et al. | ............... | 257/737 |
| 5,551,627 A * | 9/1996 | Leicht et al. | ............ | 228/180.22 |
| 6,492,197 B1 * | 12/2002 | Rinne | ........................... | 438/108 |
| 6,762,506 B2 * | 7/2004 | Amagai et al. | ................ | 257/786 |
| 6,879,041 B2 * | 4/2005 | Yamamoto et al. | ........... | 257/737 |
| 6,969,915 B2 * | 11/2005 | Tago et al. | ..................... | 257/781 |
| 6,994,920 B2 | 2/2006 | Trewiler | | |
| 7,009,299 B2 * | 3/2006 | Angst et al. | ................... | 257/772 |
| 7,064,446 B2 * | 6/2006 | Barnak et al. | ................. | 257/779 |

(Continued)

FOREIGN PATENT DOCUMENTS

WO     WO 01/86715     11/2001

OTHER PUBLICATIONS

Jackson, G.J. et al., Establishing Control Factors of Intermetallic Formation within Pb-free Solder Bumps at Flip Chip Gometries, Electronic Components and Technology Conference, 2003, pp. 1472-1479.

(Continued)

*Primary Examiner* — Chris Chu
(74) *Attorney, Agent, or Firm* — Knobbe, Martens, Olson & Bear LLP

(57) ABSTRACT

A device and a method for realizing reliable electrical contacts at low temperature and low pressure between conducting materials on, for example, different substrates are disclosed. In one aspect, a rough and brittle intermetallic layer is formed on a conducting material on a first substrate. A soft solder material layer on the other substrate is used for contacting the brittle and rough intermetallic layer that will break. As the solder material is relatively soft, contact between the broken intermetallic layer and the solder material can be realized over a large portion of the surface area. At that stage, a second intermetallic layer is formed between the solder material and the first intermetallic layer realizing electrical contact.

13 Claims, 4 Drawing Sheets

(56) References Cited

U.S. PATENT DOCUMENTS

| | | | |
|---|---|---|---|
| 7,132,721 B2 | 11/2006 | Platt et al. | |
| 7,148,569 B1* | 12/2006 | Wang | 257/738 |
| 7,626,274 B2* | 12/2009 | Amagai | 257/779 |
| 7,939,939 B1* | 5/2011 | Zeng et al. | 257/737 |
| 7,960,019 B2* | 6/2011 | Jayaraman et al. | 428/325 |
| 8,148,819 B2* | 4/2012 | Ohnishi | 257/737 |
| 8,242,378 B2* | 8/2012 | Amin et al. | 174/257 |
| 8,421,232 B2* | 4/2013 | Ikeda et al. | 257/772 |
| 2002/0027294 A1 | 3/2002 | Neuhaus et al. | |
| 2004/0126269 A1* | 7/2004 | Nozawa et al. | 420/558 |
| 2005/0067699 A1* | 3/2005 | Leong et al. | 257/737 |
| 2006/0292824 A1 | 12/2006 | Beyne et al. | |
| 2007/0114662 A1 | 5/2007 | Helneder et al. | |

OTHER PUBLICATIONS

International Search Report and Written Opinion mailed Feb. 4, 2010 in International Application No. PCT/EP2009/062125 filed Sep. 18, 2009.

* cited by examiner

METHODS AND SYSTEMS FOR MATERIAL BONDING

CROSS REFERENCE TO RELATED APPLICATIONS

This application is a continuation of PCT Application No. PCT/EP2009/062125, filed on Sep. 18, 2009, which claims priority under 35 U.S.C. §119(e) to U.S. provisional patent application 61/098,194 filed on Sep. 18, 2008. Each of the above applications is incorporated herein by reference in its entirety.

BACKGROUND OF THE INVENTION

1. Field of the Invention

The invention relates to the field of bonding. More specifically, the present invention relates to methods and systems for semiconductor bonding like flip-chip bonding and corresponding 3D integration, as well as to devices thus obtained.

2. Description of the Related Technology

Flip-chip bonding often uses an electroplated solder material to bond to a base metal using a bonding temperature higher than the melting point of the solder. During the bonding process, the liquid solder quickly reacts with the base metal to form the intermetallic compounds (IMC) joint. For temperature sensitive structures, such as advanced DRAM and 3D chip stacking integrating different devices in various levels, bonding has to be carried out at lower temperatures below the melting point.

However, below the melting temperature, the solid surface is rough and this does not allow a good contact. Cu and Sn then can only locally react with each other to form a weak IMC joint. Compared with the evaporated or sputtered Sn and Cu, this becomes even more critical for electroplated materials that are often very rough. The weak joint will result in bad electrical contacts and low mechanical strength, and hence will often cause problems for the advanced DRAM process and 3D chip stacking technology.

In order to ensure full contact between the solder and base metal, either high bonding pressure or flat bonding interface is needed to put the electroplated solder and base metal together. To realize a flat bonding interface for good contact often additional equipment such as a fly-cutter is needed. Fly-cutting, whereby a diamond blade scans over a wafer surface, can be used to make the solder or base metal uniform in height. The micro roughness can also be reduced. However, it is difficult to well control the plastic deformation of the soft materials during the cutting process with a diamond blade, which will cause some misalignments for flip-chip bonding. It can even cause electrical shortcut for the fine pitch bump connection if the plastic deformation is too large. Also the cost of fly-cutting is relatively high.

Because of the high roughness of the solder and/or base metal, flip-chip bonding may require high pressure to realize good contacts. This has some important disadvantages. First, high pressure may damage devices, for example when (ultra) low-k materials with about 40% porosity are incorporated. Second, when a thinned device wafer that has some micro cracks generated during the wafer thinning process is used for 3D integration, high bonding pressure can enlarge the micro cracks and hence also damage the device. Finally, the mechanical thinning process can also generate some defects such as dislocations and voids. These defects will re-distribute under high bonding pressure and eventually influence the local stress condition and lower the device performance.

US2002/0027294 describes the use of the randomly distributed hard particles to realize electrical connections between two metal surfaces. In this case, hard particles are affixed to metal contact surfaces and a portion of the hard particles penetrates into the base metals with pressure. Therefore, the electrical connection is only realized locally through the particles. This limits the contact area, the electrical current that can flow and the reliability. Moreover, a non-conductive adhesive layer is used between the two base metals to provide the principal force for mechanical connection.

In U.S. Pat. No. 7,132,721 a method for bonding components of MEMS is described using a solid-liquid interdiffusion process. This method is used for pressure sealing. However, in case the boning temperature is lower than the melting temperature of the solder materials, an effective bond can only be realized after several hours. In addition, very homogenous metal layers are required in order to produce the hermetically sealing. Therefore, vacuum deposition technique is used to deposit the different metal layers.

U.S. Pat. No. 6,994,920 presents a method for fusion welding of two members, but in this case the interfaces of the two members are heated to a fusion welding temperature, so high temperatures are used such as to melt the interfaces for welding.

Jackson et al. (in IEEE Electronic Components and Technology Conference p 1472-1479 (2003)) mention that the reliability and the performance of a solder joint is highly dependent on the microstructure. The intermetallic layer is brittle and the thickness can increase upon ageing. Cracks formed in a solder joint can grow until both mechanical and electrical failure occurs. Furthermore, large CuSn needles extending into the bulk of the joint are mentioned as a problem. The intermetallic in this case is mainly formed at temperatures above the melting temperature of the solder material.

SUMMARY OF CERTAIN INVENTIVE ASPECTS

Certain inventive aspects relate to methods and systems for good bonding of materials, such as e.g. integrated circuits, as well as devices thus obtained. It is an advantage of certain inventive aspects that good bonding between materials may be obtained at low temperature and low pressure.

One inventive aspect relates to a method for realizing electrical contact between a first conducting material on a first substrate and a second conducting material on a second substrate. The method includes (a) receiving, e.g. by obtaining it of the shelf or by depositing it, a first intermetallic layer on the first conducting material on the first substrate, wherein the first intermetallic layer is brittle and has a roughness such that it breaks upon contacting the solder material part with a low pressure, e.g. a pressure lower than about 50 MPa, e.g. lower than about 35 MPa, e.g. about 20 MPa or lower, (b) receiving, e.g. by obtaining it of the shelf or by depositing it, a solder material on the second conducting material, wherein the solder material has a lower melting point than the first and second conducting materials and the first intermetallic layer, wherein the solder material is softer than the intermetallic layer, (c) bringing the solder material in contact with the first intermetallic layer at a temperature below the melting temperature of the solder material such that the first intermetallic layer breaks, (d) bringing the solder material in closer contact with the first intermetallic layer at a temperature below the melting temperature of the solder material such that the solder material fills at least part of the holes in the surface of the first intermetallic layer after breaking the first intermetallic layer, and (e) realizing a second intermetallic layer at the interface between the solder material and the first intermetallic layer at a temperature below the melting temperature of the solder material.

The first intermetallic layer may be brittle such that it breaks with little deformation. The solder material may form a second intermetallic layer with the first intermetallic layer at a temperature below the melting temperature of the solder material. Breaking in the process (c) may comprise breaking of protrusions, e.g. sharp protrusions, of the rough first intermetallic layer.

The first intermetallic layer may be in a stable phase such that it does not react with the first metal layer on the first substrate.

The thickness, e.g. the initial thickness, of the first intermetallic layer may be between about 1000 nm and 2000 nm.

The intermetallic layer may have an RMS surface roughness higher than about 0.2 µm and a peak-to-valley height difference higher than about 0.5 µm.

The first intermetallic layer may break if between about 30% and 70% of the solder material area is in contact with the first intermetallic layer.

The solder material may fill at least part of the holes in the surface of the first intermetallic layer when more than about 50% of the solder material area is in contact with the first intermetallic layer.

The solder material may substantially fill all the holes in the surface of the first intermetallic layer in the contacting area such that it is fully in contact with the first intermetallic layer. Substantially filling all the holes may comprise filling at least about 50% of the holes, particularly at least about 75%, more particularly at least about 90%, still more particularly at least about 95%, more particularly at least about 99%, and particularly all the holes in the surface.

The solder material may have a volume such that it is fully consumed after forming the second intermetallic layer.

The method further may comprise depositing an intermediate layer on the conducting layer prior to realizing the first intermetallic layer.

The first conducting layer may be a first metal and wherein the first intermetallic layer may be realized by depositing a second metal layer on the first metal layer and reacting the first metal layer with the second metal layer to realize the first intermetallic layer.

One inventive aspect relates to a device realizing electrical contact between a first conducting material on a first substrate and a second conducting material on a second substrate, the device comprising a second intermetallic layer formed from a first intermetallic layer on the first conducting material and a solder material on the second conducting material at a temperature below the melting temperature, the first intermetallic layer being brittle and having a roughness such that it breaks with little deformation upon contacting the solder material with a low pressure and the solder material having a lower melting point than the first and second conducting materials and the first intermetallic layer and the solder material beings softer than the first intermetallic layer.

The second intermetallic layer may be formed when the solder material area is in contact with the first intermetallic layer.

One inventive aspect relates to a kit of parts for realizing electrical contact between a first conducting material on a substrate and a second conducting material on a second substrate. The kit may include a first substrate with a first conducting material thereon and an intermetallic layer on the first conducting material, the intermetallic layer being brittle and having a roughness such that it breaks upon contacting the solder material part with a low pressure, e.g. a pressure lower than about 50 MPa, e.g. about 35 MPa or lower, e.g. about 20 MPa or lower. The kit may include a second substrate with a second conducting material thereon and a solder material on the second conducting material, the solder material having a lower melting point than the first and second conducting materials and than the first intermetallic material and the solder material being softer than the intermetallic layer. The solder material and the first intermetallic layer are adapted to form a second intermetallic layer at a temperature below the melting temperature of the solder material, when brought into contact with each other.

The first intermetallic layer may be in a stable phase such that it does not react with the first conducting layer on the first substrate.

The thickness of the first intermetallic layer may be between about 1000 nm and 2000 nm.

The intermetallic layer may have an RMS surface roughness higher than about 0.2 µm and a peak-to-valley height difference higher than about 0.5 µm.

The first intermetallic layer may be adapted for breaking if between about 30% and 70% of the solder material area is in contact with the first intermetallic layer.

The kit of parts may be adapted so that the solder material fills at least part of the holes in the surface of the first intermetallic layer when more than about 50% of the solder material area is in contact with the first intermetallic layer.

The kit of parts may be adapted so that the solder material fills all the holes in the surface of the first intermetallic layer in the contacting area such that it is fully in contact with the first intermetallic layer.

The solder material may have a volume such that it is fully consumable during formation of the second intermetallic layer.

The kit of parts may further comprise an intermediate layer between the first conducting layer and the first intermetallic layer.

The first conducting layer may be a first metal and the first intermetallic layer may be an intermetallic formed by the reaction of the first metal and a second metal.

Particular and preferred aspects of the invention may be set out in the accompanying independent and dependent claims. Features from the dependent claims may be combined with features of the independent claims and with features of other dependent claims as appropriate and not merely as explicitly set out in the claims.

One inventive aspect relates to a device and a method for realizing electrical contact between a solder material and first metal at low temperature and low pressure. Further detail may be provided as follows.

The device realizes electrical contact between a first conducting material on a first substrate and a second conducting material on a second substrate. It includes (a) a first intermetallic layer on the first conducting material on the first substrate, wherein the first intermetallic layer is brittle and has a roughness such that it breaks upon contacting the solder material part with a low pressure, and (b) a solder material on the second conducting material, wherein the solder material has a lower melting point than the first and second conducting materials and the first intermetallic layer, wherein the solder material is softer than the intermetallic layer and wherein the solder material forms a second intermetallic layer with the first intermetallic layer at a temperature below the melting temperature of the solder material.

These and other inventive aspects will be apparent from and elucidated with reference to the embodiment(s) described hereinafter.

Figure 1:
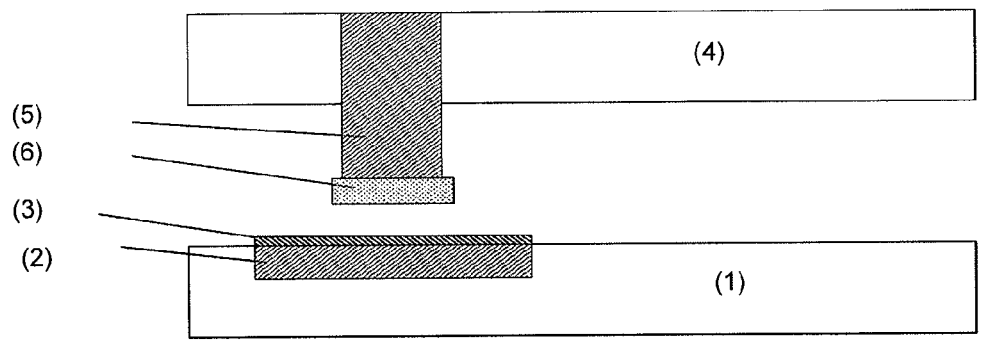
FIG. 1 is a schematic representation of the device before bringing the two substrates together, representing a kit of parts according to one embodiment.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to the drawings. The drawings are intended to be only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements or operations and not necessarily for describing a sequential or chronological order. For instance, if a first element is described as being placed on a second element, it is to be understood that this also encompasses the second element being placed on the first element. More generally, it is to be understood that the terms so used are interchangeable under appropriate circumstances and that the embodiments of the invention described herein are capable of operation in other sequences than described or illustrated herein.

Furthermore, the terms chip, wafer, substrate and the like in the description are used for descriptive purposes and are examples of the first and second substrate defined in the appended claims. The term substrate as defined herein not only refers to the base substrate or base element of a device (chip), but also to all substrate layers (e.g. insulating layers and wiring layers) defining electronic circuits therein that have been provided thereon. For instance, a substrate includes the thin-film laminated body provided on a base element. In embodiments of the present invention, this "substrate" may include a semiconductor substrate such as e.g. silicon, a gallium arsenide (GaAs), a gallium arsenide phosphide (GaAsP), an indium phosphide (InP), a germanium (Ge), or a silicon germanium (SiGe) substrate. The "substrate" may include for example one or more insulating layers such as $SiO_2$ or a $Si_3N_4$ layers in addition to a semiconductor substrate portion. The "substrate" may also include for example one or more conductive layers such as copper layers in addition to a semiconductor substrate portion. The term "substrate" is thus used to define generally the elements for layers and components that underlie a layer or portions of interest. Also, the "substrate" may be any other base on which the layers of interest may be provided, for example a glass, quartz, fused silica or metal foil. In one embodiment, the substrate may be a singulated die from a wafer, an entire wafer or any other type of substrate.

Where in certain embodiments of the present invention reference is made to "intermetallic", this term is primarily used to distinguish some layers from other layers. Furthermore it may refer to layers that are positioned, after bonding, between metallic layers.

Certain embodiments relate to a cost-effective method that allows realizing electrical contact between a solder material on a (second) substrate on rough conducting surfaces of a base substrate at low temperature, even room temperature, and at low pressure. Also the combination of the metallization on two different devices that can be electrically connected at low temperature and low pressure is presented. Certain embodiments allow realizing electrical contact between solder material or a conducting material in contact therewith and a conducting material on a first substrate at low temperatures and low pressures, i.e. at temperatures of about 130° C. and below, lower than the melting point of the solder material, for example Sn and In (about 232, and 156° C., respectively), and at a pressures of about 20 MPa and below.

Where in certain embodiments of the present invention reference is made to low pressure, reference may be made to pressures of about 50 MPa or lower, pressures of about 35 MPa or lower, or pressures of about 20 MPa or lower. At the lower end the pressure may be higher than about 5 MPa, although embodiments of the present invention are not limited thereby.

Certain embodiments allow realizing electrical contact between a solder material and a conducting material on a first substrate with low contact resistances as electrical contact is realized. Electrical connection can be realized over a large part of the contact area. Contact resistances below about 2 mΩ can be realized. Also good mechanical connection can be realized, e.g., the mechanical shear strengths of about 7 MPa or higher can be realized. The electrical and/or mechanical connection can be realized in a short time frame.

In one embodiment, good electrical contact can be realized by e.g. the interdiffusion of materials and the formation of an intermetallic layer. To allow electrical contact between the conducting material on the first substrate and the solder material at low temperature and pressure, a brittle intermetallic, called first intermetallic in the following, is introduced on the conducting material on the first substrate. As the surface of the intermetallic on the first substrate is chosen rough, the brittle intermetallic can break when coming in contact with the solder material locally and as such the contacting area is increased and good electrical contact can be realized. The solder material may be chosen such that it is relatively soft, meaning that it may be adapted for filling the holes on the surface of the (broken) intermetallic on the first substrate, thereby increasing the contacting area. The solder material forms a second intermetallic layer with the first intermetallic layer, thereby realizing good electrical contact. Also good mechanical connection can be realized.

A solder material is a material having a lower melting temperature than the other materials involved in the connecting process, being in this case the conducting materials to be contacted and the first intermetallic layer.

In case of conventional bonding (or soldering) electrical connection is realized between a solder material and a conducting material at a temperature higher than the melting temperature of the solder material. Certain embodiments of the present invention allow making electrical contact at temperatures below the melting temperature of the solder material.

In case of welding, mechanical contact is made between two materials that are heated up to a level that both materials melt. Upon cooling down at a high rate mechanical contact is realized. In one embodiment, none of the materials are heated up to their melting point.

A brittle material is a material that is liable to break when subjected to stress. In this case, the intermetallic compounds are brittle and are pressed together with solder material. Brittle material often breaks with little or no evidence of plastic deformation before breaking.

A soft material is a material that easily deforms when subjected to stress. In one embodiment, the solder material is soft and is pressed together with the intermetallic compounds.

In one embodiment, the surface roughness of a layer is defined as the maximum vertical deviation of the real surface from the ideal surface. An ideal surface is a surface which is perfectly smooth or an average surface. It can also be defined as a surface with an average height. Surface roughness can be quantified by the maximum height difference $h_t$ of the surface profile, which is defined as $h_t = h_{peak} - h_{valley}$ also called peak-to-valley height difference. $h_{peak}$ is the height of the highest point above the ideal surface and $h_{valley}$ is the height of the lowest point so below the ideal surface. Additionally, the surface roughness can also be quantified by the root mean square (RMS) value, which is a statistical measure of the roughness of a non-flat surface. The RMS roughness describes the fluctuations of the surface around an average surface. It is defined as the standard deviation of the square root of the variance i.e. RMS roughness $\sqrt{} = (1/n \Sigma_{x=1-n} (h_x - _{av})^2)$ wherein n is the number of points on the surface, $h_x$ is the height of the different points and $h_{av}$ is the average height. In the following a "rough" surface means the $h_t$ value is higher than about 0.5 µm, and an RMS roughness higher than about 0.2 µm.

With the contacting area of the solder material surface is meant the area of the solder material that may come in contact with the underlying intermetallic when both substrates are brought together.

Figure 2:
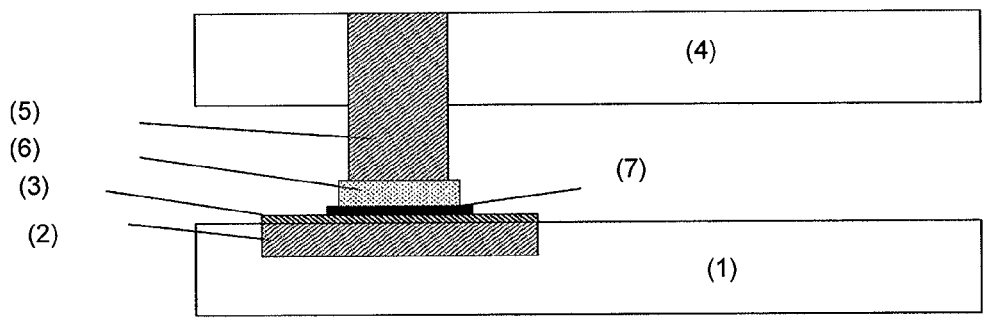
FIG. 2 is a schematic representation of the device after bringing the two substrates together, according to one embodiment.

One embodiment relates to a kit of parts for making a device using bonding at low temperature and low pressure and/or to the device thus obtained. The kit of parts before contacting and the device after contacting is represented in FIG. 1 and FIG. 2. The interface in the different steps of contacting is represented in FIG. 3a to FIG. 3d.

The kit of parts comprises a first substrate 1 comprising a conducting material 2 thereon to realize the electrical contact to for example devices included in the substrate. Such a conducting material 2 may be a conducting layer such as a metal layer, but it may also be part of or be conducting material in a via. The conducting material 2 can be a metal such as Au, Al, Cu, Co, Ni, Pd, alloys of the previous, also other conducting materials, such as conducting polymers and implanted semiconductors can be used. Also multilayers of conducting material can be used, such as Ni/Au, Ni/Cu, Cu/Au, Co/Cu and Cu/Al. In principle any conducting material can be used. The conducting material can for example be bondpads to chip in IC technology. In that case the width can for example vary between 80 µm and 100 µm.

On top of the conducting material 2 a first intermetallic layer 3 is realized. Particularly, good electrical contact is realized between the first intermetallic layer 3 and the underlying conducting material 2. Particularly, good adhesion between the intermetallic layer and the conducting material is realized.

In case the conducting material 2 in the first substrate is a metal or an alloy, the first intermetallic layer 3 may for example be formed by depositing a reactive layer on the metal or the alloy, for example by sputtering or electroplating. An intermetallic layer 3 may then be formed by diffusion of the reactive layer into the conducting layer and vice versa. A heating step can be applied for example to facilitate the interdiffusion of the materials. The following combinations are for example possible: In on Au, In on Cu, In on Ni, Sn on Cu, Sn on Ni, Sn on Co, Sn3.0Ag0.5Cu on Cu, and Cu on Al. For example in case of Cu or Au as a conducting layer, a thin Sn or In layer can be added on top to form the intermetallic. The reaction realizes good adhesion. In one embodiment, the reactive layer is relatively thin such that all material of the second material is consumed during the formation of the intermetallic layer 3 thereby still leaving unreacted conducting material underneath, so the reactive material is not diffusing any further in the remaining conducting material.

The first intermetallic layer 3 can also be deposited on the conducting material 2 on the first substrate 1. The intermetallic layer 3 can for example be deposited with sputtering. Also one or more intermediate layers between the conducting layer and the intermetallic layer 3 can be provided. The surface treatment and/or extra intermediate layers can for example be added to improve the adhesion (for example as an adhesion layer) or for realizing and/or improving electrical contact between the conducing layer and the first intermetallic layer 3.

In one embodiment, the first intermetallic layer 3 is in a stable phase. This means that it is non-reactive with the underlying conducting layer, such that the thickness is not increasing upon further processing. This is for example the case when a thin Sn layer is deposited on Cu to form the stoechiometric $Cu_3Sn$.

In one embodiment, the intermetallic layer 3 is relatively thin. The thickness can vary between about 500 nm and 5000 nm, between about 700 nm and 4000 nm, or between about 900 nm and 3000 nm, or between about 1000 nm and 2000 nm, or between about 1200 nm and 1500 nm, but other thicknesses are possible depending on the application.

In one embodiment, the first intermetallic layer 3 has a roughness that is higher than the roughness of the solder material that may or will come in contact with the first intermetallic layer 3. The RMS roughness of the intermetallic may be higher than about 0.1 µm or higher than about 0.2 µm or higher than about 0.3 µm or higher than about 0.4 µM or higher than about 0.5 µm. The RMS roughness of the intermetallic can be between about 0.1 µm and 1 µm, or between about 0.2 µm and 0.5 µm. The maximum height difference or peak-to-valley height difference can be higher than about 0.2 µm or higher than about 0.3 µm or higher than about 0.4 µm or higher than about 0.5 µm, or higher than about 0.6 µm or higher than about 0.7 µm. The peak-to-valley height difference can be between about 0.2 µm and 2 µm or between about 0.5 µm and 1 µm.

Figure 3A:
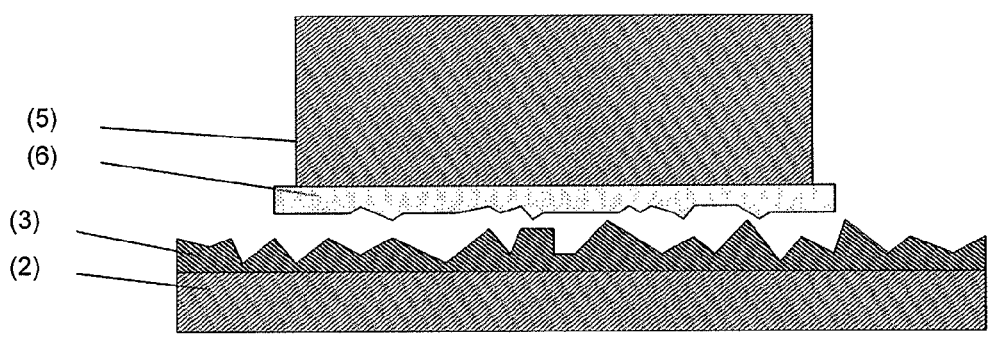
FIG. 3a to FIG. 3d illustrates different processes in realizing electrical contact indicating (a) the situation before contacting; (b) breaking of the first intermetallic layer; (c) the solder material filling the holes in the surface of the first intermetallic layer; and (d) the formation of the second intermetallic layer, according to one embodiment.
Figure 3B:
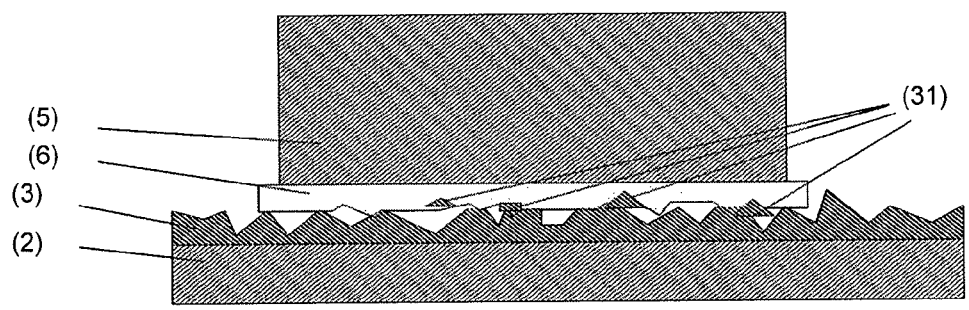

At the early stage of contacting (for example in flip-chip bonding), the solder material 6 will only locally contact the first intermetallic layer 3 due to the fact that the intermetallic layer 3 is very rough, e.g. made by electroplating. As advantageously the first intermetallic layer 3 is brittle, even though the total load applied (for example in flip-chip bonding) is not high, the local pressure is still high enough to break this brittle intermetallic layer. A rough surface is thereby advantageous as a high local pressure is created that breaks the brittle intermetallic layer 3. Thereby a larger contact area between the solder material 6 and the intermetallic layer 3 is created. This is illustrated in FIGS. 3a and 3b. In FIG. 3a to FIG. 3d detailed views are given of the different steps of the solder material contacting the underlying intermetallic layer. In FIG. 3a there is no contact between the solder material and the intermetallic layer. FIG. 3b illustrates the case where the solder material contacts the intermetallic and the intermetallic layer is broken. Upon further contacting, the intermetallic layer can further be broken.

The intermetallic layer 3 may break when only a percentage of the contacting area of the solder material surface is in contact with the surface of the intermetallic, for example about 20% or 30% or 40% or 50% or 60% or 70% or 80% of the contacting area of the solder material surface is in contact with the intermetallic layer 3. So the intermetallic layer 3 can break when the percentage of the contacting area of the solder material surface in contact with the surface of the intermetallic is between about 20% and 80%, or between about 30% and 70% or between about 40% and 60%.

Electrical contact between the first conducting material 2 on the first substrate 1 and a second conducting material 5 on the second substrate 4 can be realized between the first intermetallic layer 3 and a solder material 6 on the second conducting material 5. Advantageously, the solder material 6 realizes good electrical contact with the second conducting material 5. If the second conducting material 5 on the second substrate 4 is well-chosen, this can be used as a solder material and an extra solder material layer 6 is not needed. In one embodiment, the second conducting material 5 also fulfils the function of the solder material 6.

In order to further assist in a good and reliable electrical and mechanical contact between the solder material 6 and the first intermetallic layer 3 on the first substrate 1, some characteristics of the solder material 6 may be advantageous, such as the roughness and the hardness. In view of the interaction between solder material 6 and intermetallic layer 3 upon contact, preferred characteristics of the solder material and the intermetallic layer may be selected as function of each other.

The roughness of the solder material 6 can be higher or lower than the roughness of the first intermetallic layer 3. In one embodiment, the roughness of the solder material 6 is lower than the roughness of the first intermetallic layer 3, such that, at an early stage of contacting, the solder material 6 will only locally contact this first intermetallic layer 3. The roughness of the first intermetallic layer 3 may be rough as such. When depositing a reactive layer on a metal layer to realize the first intermetallic, using for example electroplating, the intermetallic may be rough due to the fact that the electroplated metal layers are rough. Alternatively a roughening process could be performed. Furthermore, as the first intermetallic layer is brittle, it will break with little deformation and the local pressure is still high enough to break this brittle intermetallic layer. This is illustrated in FIG. 3b.

Figure 3C:
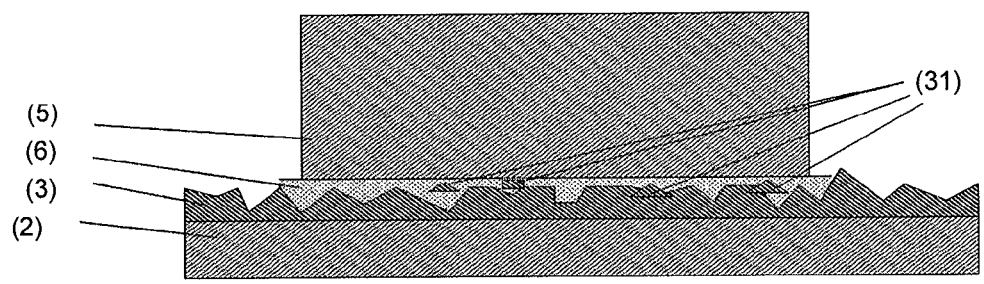
Figure 3D:
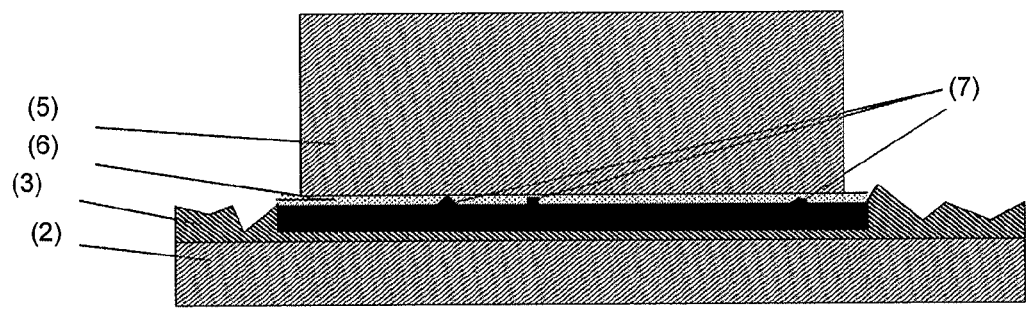

Advantageously, the solder material 6 may be relatively soft, i.e. softer than the intermetallic material 3 on the conducting material 2, such that the solder material 6 deforms upon further contacting the intermetallic layer 3. That way it can at least partially follow the topography of the broken first intermetallic layer 3. It can at least partially fill the holes in the surface of the intermetallic layer 3. Advantageously, it completely fills the holes in the surface, thereby realizing electrical connection over the whole contacting area. This is illustrated in FIG. 3c. The contacting area between the solder material 6 and the first intermetallic layer 3 can become large when the first intermetallic layer 3 is broken and the solder material 6 follows the contours of this broken layer. This increases the contacting area between the solder material 6 and the first intermetallic layer 3 and that way non-local electrical connection, i.e. overall good electrical connection, can be realized.

Once an intimate contact is created between the solder material 6 and the first intermetallic layer 3, the solder material 6 forms a second intermetallic 7 with the first intermetallic 3 on the first substrate 1. Advantageously, the solder material 6 can diffuse through the intermetallic layer 3 and further react with the underlying conducting material to form a high quality intermetallic joint. An extra heating process can be applied to facilitate the formation of the second intermetallic layer 7. In one embodiment, it may be performed below the melting points of the solder material 6, the conducting material 2, 5 and the first intermetallic 3.

In case of a thick solder material 6, the second intermetallic layer 7 can become relatively thick. As it is brittle, the mechanical stability may be lower. This is no problem in case the first substrate and the second substrate are made of materials with a comparable thermal expansion coefficients. This is for example the case in 3D integration where two silicon chips with the same expansion coefficients are electrically connected to each other.

Especially when connecting substrates with different thermal expansion coefficients, the second intermetallic layer 7 may be thin in one embodiment such that the contact is mechanically stable. Therefore, the solder material 6 can be chosen to be thin such that it is fully consumed after forming the second intermetallic layer 7. After formation, the second intermetallic layer 7 may be in a stable phase, such that it may react with the first intermetallic 3 and underlying metal 2 during formation but that the reaction stops thereafter. The second intermetallic layer 7 thus can be relatively thin. This improves the mechanically stability of the connection.

Examples of solder/base material combinations are electroplated Sn in combination with Cu or electroplated In in combination with Au serving as the solder material and base metal, respectively. A brittle CuSn or AuIn first intermetallic layer with a certain thickness can be formed on top of the base layer of Cu or Au on one chip. To realize the second intermetallic layer a thick Sn/In layer can be deposited as a solder material on the other chip. Furthermore a wet cleaning process can be incorporated on the solder material before the bonding process to reduce its oxidation, which impedes the efficiency of low-T bonding.

Certain embodiments allow realizing electrical contact between conducting regions on different substrates at low temperatures. These low temperatures are favourable in various applications, especially when the materials used on the substrates cannot withstand high temperatures.

One embodiment relates to a method for realising electrical contact between a first conducting material 2 on a first substrate 1 and a second conducting material 5 on a second substrate 4. The method may be especially suitable for flip-chip bonding of semiconductor chips, although the invention is not limited thereto. The method comprises obtaining receiving a first substrate with first conducting material thereon and a first intermetallic layer on top of the conducting material. The first intermetallic layer 3 is brittle and has a roughness such that it breaks with little deformation upon contacting the solder material part with a low pressure. The method also comprises receiving a second substrate 4 having a second conducting material 5 with a solder material 6 thereon. The method may comprise depositing the solder material 6 on the second conducting material 5. The solder material 6 has a lower melting point than the first and second conducting materials 2, 5 and the first intermetallic layer 3, wherein the solder material 6 is softer than the intermetallic layer 3. The method also comprises bringing the solder material 6 in contact with the first intermetallic layer 3 at a temperature below the melting temperature of the solder material 6 such that the first intermetallic layer 3 breaks. The method comprises thereafter bringing the solder material in closer contact with the first intermetallic layer 3 at a temperature below the melting temperature of the solder material 6 such that the solder material 6 fills at least part of the holes in the surface of the first intermetallic layer 3 after breaking the first intermetallic layer 3.

The method further comprises realizing a second intermetallic layer 7 at the interface between the solder material 6 and the first intermetallic layer 3 at a temperature below the melting temperature of the solder material 6. Further method processes optionally also may be comprised, expressing the functionality of components as described for the devices.

By way of illustration, an example of a device that can be made is given below, embodiments of the present invention not being limited thereto. A silicon wafer with high density memory cells, Cu back-end-of-line, and through-silicon-via (TSV) Cu interconnect is provided that can be used in 3D stacking. The Cu/Sn combination can for example be used in 3D integration where dies are stacked on top of each other and electrical connection between the Cu back-end-of-line of the two dies is realized using Sn as a solder material. Often low-k materials are used for capacitance reduction. These low-k materials often cannot withstand high pressures. Furthermore, such advanced DRAM devices are very sensitive to exposure to higher temperatures, and bonding needs to be done at low temperatures. One embodiment allows realizing electrical contact between the dies at temperatures well below the temperatures that may damage the memory cells.

Another application is flip-chip bonding. Dies that need to be bonded, often cannot withstand high temperatures, for example a MEMS structure will not be properly functional if it is processed at temperatures above about 200° C. At the early stage of flip-chip bonding, Sn or In only locally contact this first intermetallic layer due to the fact that the first intermetallic layer on the electroplated metal layers are very rough. Even though the total load applied for flip-chip bonding is not high, the local pressure is still high enough to break this brittle intermetallic layer. The rough intermetallic surface experiences a high local pressure upon contacting the solder material such as to break the brittle first intermetallic layer, which creates a larger contact area. In addition, this intermetallic layer has better affinity with Sn or In than that of Cu or Au. As a result, intimate contact between the solder material and intermetallic can be achieved.

Experiment on Au/In

Figure 4:
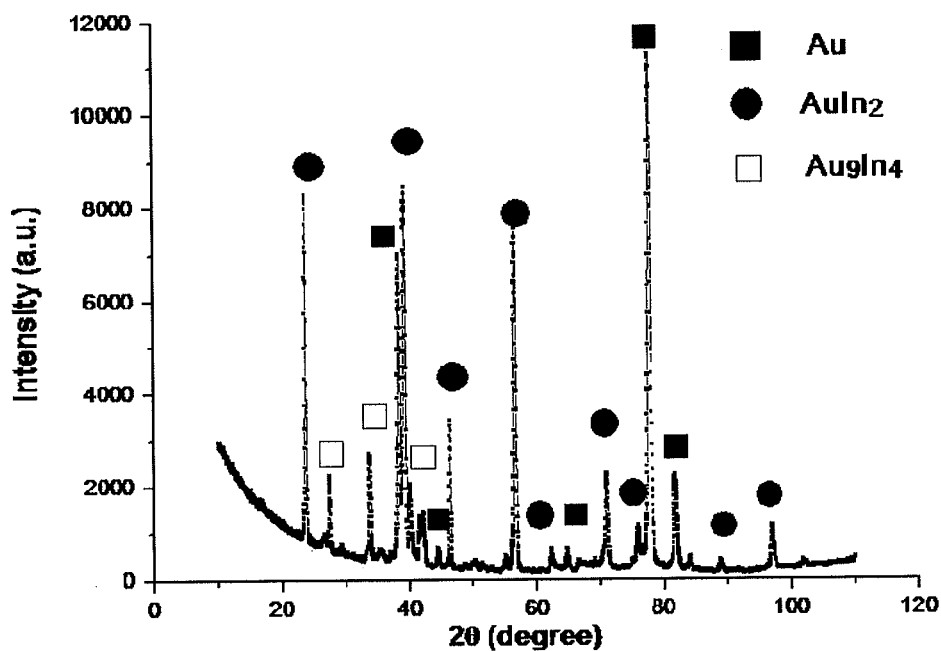
FIG. 4 is a graph illustrating XRD spectrum of an AuIn intermetallic layer as obtained in a method according to one embodiment
Figure 5:
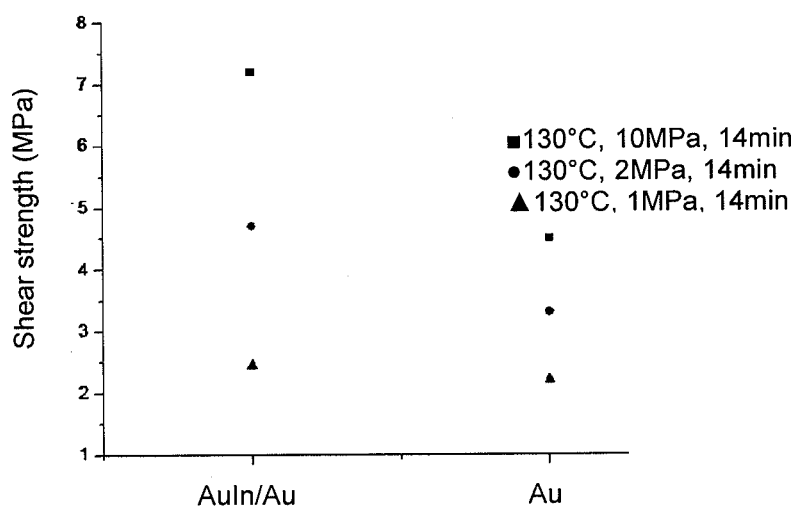
FIG. 5 is a graph illustrating shear strength of In bonded to Au with and without a AuIn intermetallic layer, illustrating the advantages of one embodiment.

The following was prepared to bond two chips at low temperature and pressure. First, a thick In solder material bump of about 7 μm was deposited on one chip by electroplating, and a thin (of about 1 μm thickness) In layer was deposited on another chip that contains a thick Au layer. The thin In layer reacted with the thick Au layer to form an AuIn intermetallic layer. This was confirmed by XRD (see FIG. 4), where many reflection peaks of AuIn intermetallic compounds can be distinguished. Then these two chips were placed face-to-face and bonded at about 130° C. with a pressure of about 1, 2 and 10 MPa for about 14 minutes, respectively. After bonding, the cross-section of the bonded interface was studied by scanning electron microscopy, and also the shear test is carried out in order to investigate the bonding quality.

From the cross-section backscattering SEM it was found that In was successfully bonded to Au through an intermetallic layer, where some of the intermetallics were broken into indium. A few layers with different contrast could also be observed, indicating the transition from Au, AuIn intermetallics, and In.

For comparison, In was directly bond to Au without the intermetallic layer. In this case, some intermetallic compounds are formed at the interface, which is smooth (in contrast to the previous case). However, often bad contacts at the Au/In interface were found. Consequently, it can be derived that the bonding of In to Au with an intermetallic layer is better than the bonding without this intermetallic layer. Therefore, it can be concluded that a rough brittle reactive intermetallic layer can increase the contact area, the electrical contact, and the mechanical bonding strength in case bonding at low temperature and pressure.

Experiment on Cu/Sn

Figure 6A:
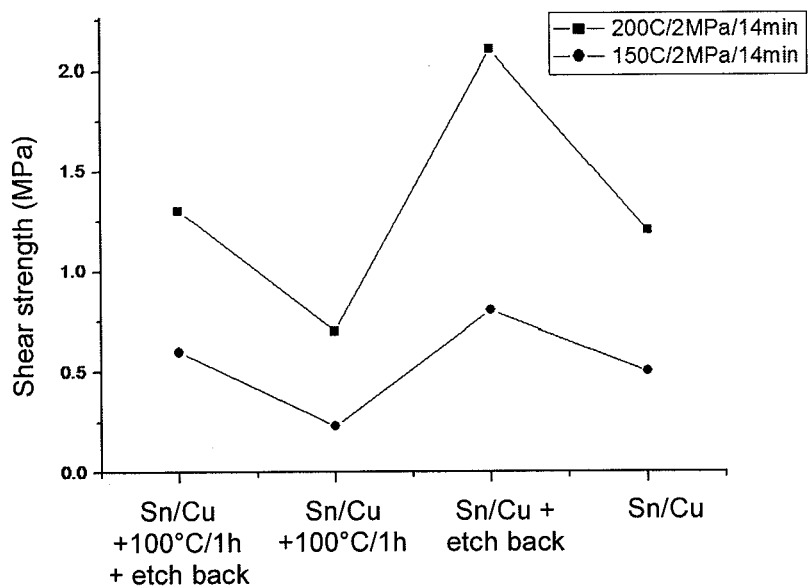
FIG. 6a and FIG. 6b are drawings illustrating shear strength of Sn bonded to Cu with and without a CuSn intermetallic layer (a) bonding pressure of 2 MPa (b) bonding pressure of 10 MPa, illustrating the advantages of one embodiment.
Figure 6B:
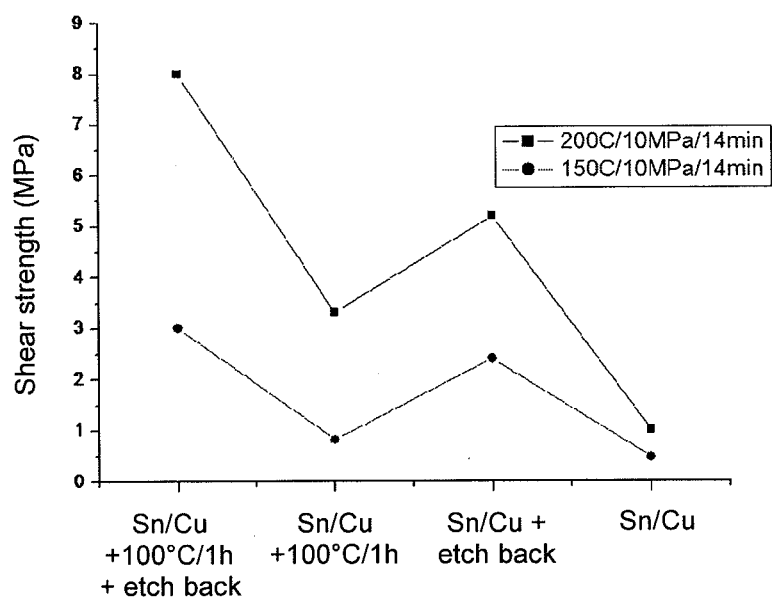

Cu to Sn bonding follows the similar procedure as Au to In bonding. A thick Sn of about 5 μm solder material bump was deposited on one chip by electroplating, and a thin Sn layer was deposited on another chip that contains a thick Cu layer. Since the peak-to-valley roughness ($h_t$) of the electroplated Sn was between about 0.5-1.0 μm, an about 1.5 μm-thick Sn layer is deposited on Cu so that the Cu is fully covered by Sn. The thin Sn layer reacts with the thick Cu layer to form CuSn intermetallics. Since the growth rate of CuSn intermetallic is lower than that of AuIn intermetallics, the chip was heated up to about 100° C. in order to accelerate the Cu/Sn reaction. After that, the excess Sn on this chip was removed by an HCl etch to guarantee that Cu is bonded to Sn (on the other chip) through the CuSn intermetallics. Then these two chips were placed face-to-face, and were bonded at about 150° C. and 200° C. with a pressure of about 2 and 10 MPa for about 14 minutes, respectively. Finally, the shear strength is measured by shear test. As shown in FIG. 6a and FIG. 6b, the shear strength of Cu bonded to Sn with an intermetallic layer (after etching away the excess Sn) was higher than that of without this intermetallic layer. This was consistent with what was observed in the Au/In system.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

What is claimed is:

1. A method of realizing electrical contact between a first conducting material on a first substrate and a second conducting material on a second substrate, the method comprising:
   (a) receiving a first intermetallic layer on the first conducting material on the first substrate, wherein the first intermetallic layer is brittle and has a roughness such that it breaks upon contacting a solder material with a low pressure, wherein excess metal on the first intermetallic layer is removed;
   (b) receiving a solder material on the second conducting material, wherein the solder material has a lower melting point than the first and second conducting materials and the first intermetallic layer, wherein the solder material is softer than the first intermetallic layer;
   (c) bringing the solder material in contact with the first intermetallic layer at a temperature below the melting temperature of the solder material such that the first intermetallic layer breaks;
   (d) bringing the solder material in closer contact with the first intermetallic layer at a temperature below the melting temperature of the solder material such that the solder material fills at least part of the holes in the surface of the first intermetallic layer after breaking the first intermetallic layer; and
   (e) forming a second intermetallic layer at the interface between the solder material and the first intermetallic layer at a temperature below the melting temperature of the solder material.

2. The method according to claim 1, wherein the first intermetallic layer is in a stable phase such that it does not react with the first conducting material on the first substrate.

3. The method according to claim 1, wherein the thickness of the first intermetallic layer is between about 1000 nm and 2000 nm.

4. The method according to claim 1, wherein the intermetallic layer has a root mean square (RMS) surface roughness higher than about 0.2 μm and a peak-to-valley height difference higher than about 0.5 μm.

5. The method according to claim 1, wherein the first intermetallic layer breaks if between about 30% and 70% of the solder material area is in contact with the first intermetallic layer.

6. The method according to claim 1, wherein the solder material fills at least part of the holes in the surface of the first intermetallic layer when more than about 50% of the solder material area is in contact with the first intermetallic layer.

7. The method according to claim 1, wherein the solder material substantially fills all the holes in the surface of the first intermetallic layer in the contacting area such that it is fully in contact with the first intermetallic layer.

8. The method according to claim 1, wherein the solder material has a volume such that it is fully consumed after forming the second intermetallic layer.

9. The method according to claim 1, the method further comprising depositing an intermediate layer on the first conducting material prior to receiving the first intermetallic layer.

10. The method according to claim 1, wherein the first conducting material comprises a first metal and wherein the first intermetallic layer is received by depositing a layer of a second metal on the first metal and reacting the first metal with the second metal layer to form the first intermetallic layer.

11. The method according to claim 1, wherein the low pressure is a pressure of about 50 MPa or lower.

12. The method according to claim 11, wherein the low pressure is a pressure of about 20 MPa or lower.

13. The method according to claim 1, wherein the low pressure is a pressure of about 20 MPa or lower.

* * * * *